(12) United States Patent
Appel et al.

(10) Patent No.: US 7,447,031 B2
(45) Date of Patent: Nov. 4, 2008

(54) COCKPIT FOR A MOTOR VEHICLE

(75) Inventors: Peter Appel, Hainburg (DE); Harald Dittmann, Babenhausen (DE); Jürgen Dreyer, Schaafheim-Mosbach (DE); Heiko Schnieders, Schaafheim (DE)

(73) Assignee: Siemens Aktiengesellschaft, Munich (DE)

( * ) Notice: Subject to any disclaimer, the term of this patent is extended or adjusted under 35 U.S.C. 154(b) by 45 days.

(21) Appl. No.: 11/602,902

(22) Filed: Nov. 21, 2006

(65) Prior Publication Data

US 2007/0115636 A1  May 24, 2007

(30) Foreign Application Priority Data

Nov. 24, 2005  (DE) .................. 10 2005 056 046

(51) Int. Cl.
*H05K 7/20*   (2006.01)
*F28F 7/00*   (2006.01)

(52) U.S. Cl. .................. 361/700; 165/104.33; 361/690
(58) Field of Classification Search .............. None
See application file for complete search history.

(56) References Cited

U.S. PATENT DOCUMENTS 5,761,038 A * 6/1998 Tanaka .................. 361/700
5,980,306 A 11/1999 Tanaka et al.
6,944,022 B1 * 9/2005 Kehret et al. .............. 361/690
7,119,284 B2 * 10/2006 Bel et al. .................. 174/252
2003/0095383 A1 5/2003 Kline et al.
2004/0242026 A1 12/2004 Glovatsky et al.

FOREIGN PATENT DOCUMENTS

| DE | 101 39 018 | 2/2003 |
|---|---|---|
| DE | 102 53 853 | 6/2003 |
| DE | 101 60 935 A1 | 7/2003 |
| DE | 103 42 961 | 4/2004 |
| DE | 20 2004 005 181 | 10/2004 |
| DE | 10 2004 027 047 | 1/2005 |
| GB | 2 336 898 A | 11/1999 |
| JP | 2004058943 A | 2/2004 |
| WO | WO 2005/076685 A1 | 8/2005 |

\* cited by examiner

*Primary Examiner*—Gregory D Thompson
(74) *Attorney, Agent, or Firm*—Cohen Pontani Lieberman & Pavane LLP

(57) ABSTRACT

A cockpit for installation in a motor vehicle between two A-pillars includes a printed board having electronic components connected to a crossmember via a pipe. The pipe is filled with a heat-absorbing fluid and conducts away heat generated by the electronic components to the crossmember.

11 Claims, 2 Drawing Sheets

COCKPIT FOR A MOTOR VEHICLE

BACKGROUND OF THE INVENTION

The invention relates to a cockpit provided for installation in a motor vehicle between two A-pillars, with electronic components which are arranged therein and emit heat, and with a crossmember extending essentially over the entire length of the cockpit.

Cockpits of this type are frequently used in current motor vehicles and have electronic devices, such as, for example, a display panel, radio, navigation unit and other electronic components, and are known from practice. It is likewise known to arrange a central illumination device with an electronically controlled light source in the cockpit. The electronic devices have a multiplicity of electronic components and are arranged within the cockpit. During operation, the electronic components generate heat which has to be removed from the cockpit in an elaborate manner which increases the cost. In the case of the cockpits known from practice, the electronic components have heat sinks and fans which are intended to conduct away the heat. Furthermore, it is known to arrange the electronic components in the region of ventilation, which is present in any case for the interior of the motor vehicle.

Disadvantages of the known cockpits include the fact that the conducting away of the generated heat exclusively via heat sinks fastened on the electronic components is simply inadequate and that a fan for assisting the removal of heat from the electronic components causes annoying noises.

SUMMARY OF THE INVENTION

It is an object of the invention to provide a cockpit of a motor vehicle that allows reliable cooling of the electronic components and avoids annoying noises.

According to a preferred embodiment of the present invention, the electronic components are connected to a crossmember via a pipe filled with a heat-absorbing fluid.

This design enables the heat generated by the electronic components to be transmitted via the pipe and the heat-absorbing fluid directly to the supporting structure of the cockpit according to the invention, which supporting structure is the crossmember. Since the crossmember extends essentially over the entire length of the cockpit according to the invention and therefore has very large dimensions, a particularly large amount of heat energy can be conducted away from the electronic components. With the pipe filled with the heat-absorbing fluid, the heat is transmitted to the fluid and passes by self-movements from the electronic components to the crossmember. Pipes of this type with heat-absorbing fluid arranged therein are also referred to as a "heat pipe". The conducting away of heat by the pipe and the heat-absorbing fluid arranged therein does not require any noise-generating fans and also makes it possible for heat to be conducted away from the electronic devices having the electronic components.

The conducting away of heat by the pipe into the crossmember is improved, according to an advantageous embodiment of the invention, if the pipe is connected at a first end to a first flange, and if the first flange is screwed or riveted to the crossmember. The screwing or riveting leads to simple installation of the cockpit according to the invention with high heat conductivity.

The structural outlay for conducting away heat from a plurality of electronic components can be kept particularly low, according to another embodiment of the invention, if the pipe is connected at its second end facing the electronic components to a second flange, and if the second flange is fastened on a printed circuit board or structure comprising the electronic components.

The printed circuit board or the structure of the cockpit could be fastened, for example directly, on the crossmember. However, the cockpit according to the invention can be manufactured with a particularly low weight and is nevertheless capable of removing heat from the electronic components if the printed circuit board or the structure of the cockpit is fastened to a plastic structural component connected to the crossmember.

According to another embodiment of the invention, the heat can be transmitted by the pipe to the adjacent structural component over a particularly large surface area if at least one of the flanges has a plate connected to the pipe. This transmission of heat over a large surface area enables the heat to be conducted away particularly reliably. Furthermore, if appropriately dimensioned, the plate likewise contributes to a dissipation of heat and therefore to an additional removal of heat from the electronic components.

A particularly reliable transmission of heat between the individual structural components of the cockpit according to the invention can be achieved in a simple manner if the pipe is welded or soldered to the plate of the flange. The welding or the soldering ensures that the connection has particularly high heat conductivity.

Compensation of tolerances between the electronic components and the crossmember can be produced in a simple manner, according to another embodiment of the invention, if the pipe has at least one bend. Furthermore, this makes it possible for forces introduced via the pipe into the electronic components to be kept particularly small. One or more bends and, in addition, a suitable selection of material for the pipe permit relative movements between the electronic components and the crossmember.

The removal of heat from the electronic components is further increased, according to another embodiment of the invention, if the pipe is manufactured from a light metal. The light metal is preferably an aluminum alloy.

According to another embodiment of the invention, the heat-absorbing fluid is capable of simply circulating between the heat-generating electronic components and the crossmember and of removing heat generated at the crossmember if the pipe is of a multi-wall design and forms a closed circuit for the heat-absorbing fluid.

The conducting away of heat from the electronic components is further improved, according to another embodiment of the invention, if the crossmember is manufactured from a light metal.

According to another embodiment of the invention, the crossmember has a high heat-conducting capacity and can be manufactured particularly cost-effectively if the crossmember is manufactured from a magnesium die-cast. Stiffening ribs of such crossmembers made from magnesium die-cast can also be designed, by means of suitable arrangement and dimensioning, as cooling ribs. This design therefore contributes to a great amount of heat being removed by the crossmember.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The invention permits numerous embodiments. To further clarify its basic principle, one of these is illustrated in the drawing and is described below.

DETAILED DESCRIPTION OF THE PRESENTLY PREFERRED EMBODIMENTS

Figure 1:
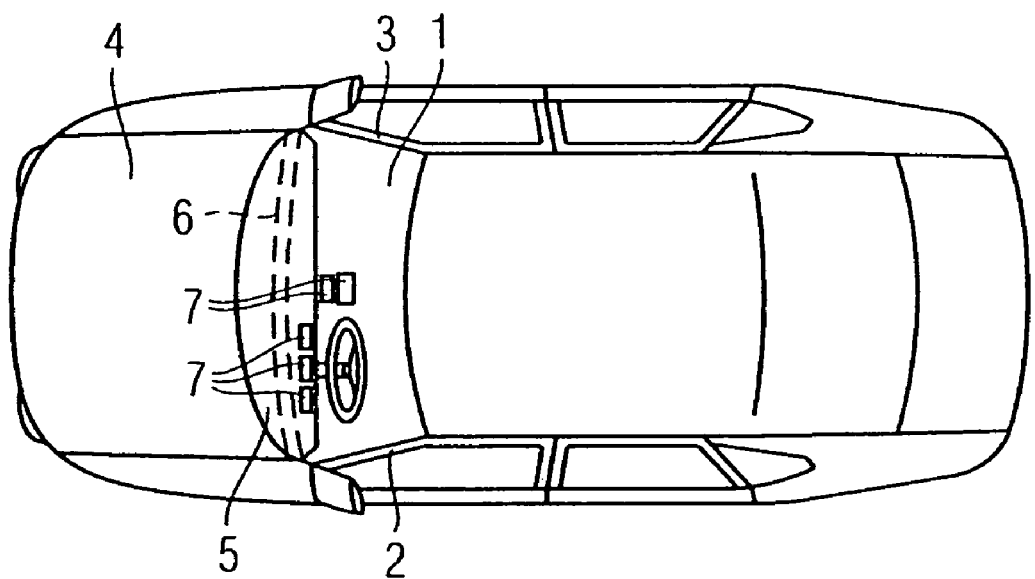
FIG. 1 is a diagrammatic top view of a motor vehicle with a cockpit according to the invention.

FIG. 1 shows a motor vehicle from above with two A-pillars 2, 3 laterally bounding a windshield 1. A hood 4 adjoins the windshield 1 in the direction of travel. Below the windshield 1, a cockpit 5 of the motor vehicle is fastened between the two A-pillars 2, 3. A crossmember 6 which extends over the entire length of the cockpit 5 is arranged within the cockpit 5. The cockpit 5 supports a plurality of electronic devices 7, such as, for example, a display panel, a navigation unit and a radio.

Figure 2:
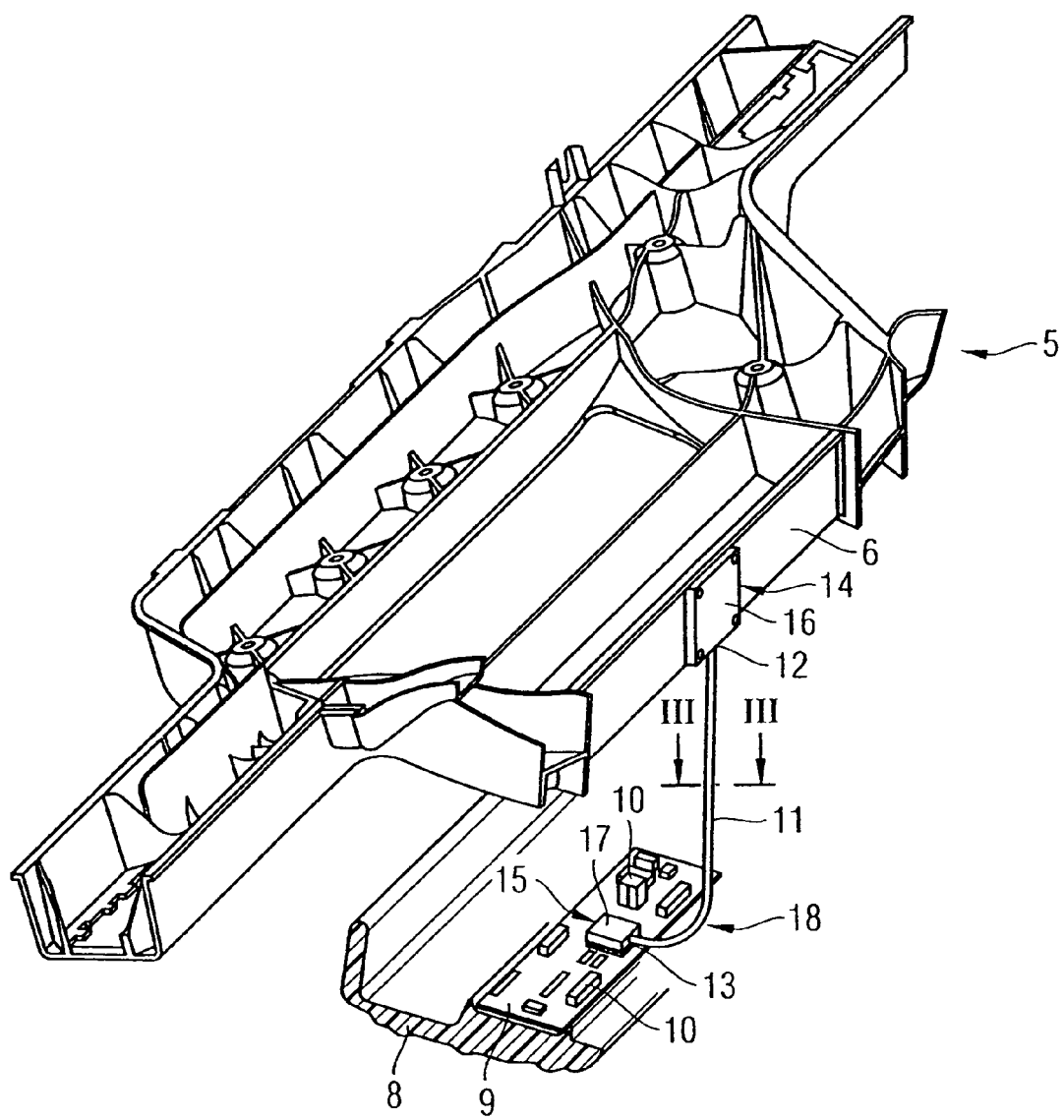
FIG. 2 is a perspective view of a partial region of the cockpit of FIG. 1.

FIG. 2 shows a partial region of the cockpit 5 of FIG. 1 with the crossmember 6 and a plastic structural component 8. The plastic structural component 8 supports a printed circuit board 9 of one of the electronic devices 7 illustrated in FIG. 1. A plurality of electronic components 10 are arranged on the board 9. During operation, these electronic components 10 generate a dissipation loss which is converted into heat and is output into the surroundings. The printed circuit board 9 is connected to the crossmember 6 via a pipe 11. The ends 12, 13 of the pipe each have a flange 14, 15 with a plate 16, 17. The plates 16, 17 of the flanges 14, 15 are screwed or riveted to the crossmember 6 and the printed circuit board 9. The pipe 11 is welded or soldered to the plates 16, 17. Furthermore, the pipe 11 has a bend 18 which permits slight movements between the crossmember 6 and the board 9 and therefore compensates the tolerances of the structural components.

Figure 3:
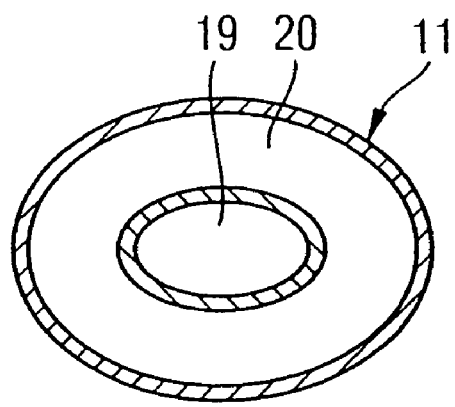
FIG. 3 is a sectional view of a pipe of the partial region of the cockpit of FIG. 2 along the line III-III.

FIG. 3 shows the pipe 11 of FIG. 2 in a sectional illustration along the line III-III. It can be seen here that the pipe 11 is of multi-wall design and has two chambers 19, 20 for receiving a heat-absorbing fluid. At the ends 12, 13 of the pipe 11 that are illustrated in FIG. 2, the two chambers 19, 20 are connected to each other and therefore permit circulation of the heat-absorbing fluid.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A cockpit installable in a motor vehicle between two A-pillars, comprising:
   electronic components which emit heat;
   a crossmember extending essentially over an entire length of the cockpit; and
   a pipe filled with a heat absorbing fluid and connecting the electronic components to the crossmember so that at least a portion of the heat emitted by the electronic components is conducted through the pipe to the crossmember by the heat absorbing fluid.

2. The cockpit of claim 1, further comprising a first flange screwed or riveted to the crossmember, wherein the pipe has a first end connected to the first flange.

3. The cockpit of claim 2, further comprising a printed circuit board or a structure comprising the electronic components, and a second flange fastened to the printed circuit board or the structure, wherein the pipe has a second end facing the electronic components and connected to the second flange.

4. The cockpit of claim 3, further comprising a plastic structural component connected to the crossmember, wherein the printed circuit board or the structure is fastened to the plastic structural component.

5. The cockpit of claim 3, wherein at least one of the first and second flanges has a plate connected to the pipe.

6. The cockpit of claim 5, wherein the pipe is welded or soldered onto the plate.

7. The cockpit of claim 1, wherein the pipe has at least one bend.

8. The cockpit of claim 1, wherein the pipe is manufactured from a light metal.

9. The cockpit of claim 1, wherein the pipe has multiple walls defining chambers forming a closed circuit for the heat-absorbing fluid.

10. The cockpit of claim 1, wherein the crossmember is manufactured from a light metal.

11. The cockpit of claim 10, wherein the crossmember is manufactured from a magnesium die-cast.

* * * * *